(12) United States Patent
Zhang (10) Patent No.: US 10,659,012 B1
(45) Date of Patent: May 19, 2020

(54) OSCILLATOR AND METHOD FOR OPERATING AN OSCILLATOR

(71) Applicant: NXP B.V., Eindhoven (NL)

(72) Inventor: Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/184,871

(22) Filed: Nov. 8, 2018

(51) Int. Cl.
*H03K 3/03* (2006.01)
*H03K 3/012* (2006.01)
*H03L 3/00* (2006.01)
*H03K 19/0175* (2006.01)

(52) U.S. Cl.
CPC .......... *H03K 3/012* (2013.01); *H03K 3/0315* (2013.01); *H03K 19/017509* (2013.01); *H03L 3/00* (2013.01); *H03B 2200/0094* (2013.01)

(58) Field of Classification Search
CPC .. H03B 5/06; H03B 2200/0094; H03K 3/012; H03K 3/0315; H03K 3/0322; H03L 3/00; H03L 7/0995–0998
USPC .......................................................... 331/57
See application file for complete search history.

(56) References Cited

U.S. PATENT DOCUMENTS

| | | | |
|---|---|---|---|
| 4,560,954 A | 12/1985 | Leach | |
| 5,206,609 A | 4/1993 | Mijuskovic | |
| 5,552,751 A | 9/1996 | Cooper | |
| 5,623,234 A * | 4/1997 | Shaik | G06F 1/08 327/292 |
| 5,903,521 A * | 5/1999 | Relph | H03K 3/0315 327/277 |
| 6,337,589 B1 * | 1/2002 | Ooishi | G11C 7/22 327/156 |
| 6,353,351 B1 * | 3/2002 | Aikawa | H03L 7/00 327/114 |
| 6,747,521 B1 | 6/2004 | Allott | |
| 6,768,387 B1 * | 7/2004 | Masuda | H03K 3/011 331/11 |
| 8,134,413 B2 | 3/2012 | Filipovic et al. | |
| 8,508,267 B1 | 8/2013 | Sreekiran | |
| 9,035,705 B2 | 5/2015 | Bruset et al. | |
| 9,099,995 B2 | 8/2015 | Hinrichs et al. | |
| 9,160,315 B2 | 10/2015 | Moriwaki | |
| 9,432,034 B2 | 8/2016 | Bruset et al. | |
| 9,590,597 B2 | 3/2017 | Kossel et al. | |
| 9,698,763 B1 | 7/2017 | Luo et al. | |
| 10,003,326 B1 | 6/2018 | Lee | |
| 10,075,133 B2 | 9/2018 | Kuppambatti | |
| 10,083,740 B2 | 9/2018 | Ecker | |
| 10,447,253 B2 * | 10/2019 | Khare | H03K 3/011 |

(Continued)

OTHER PUBLICATIONS

Azarmehr, M., et al., "Low-power oscillator for passive radio frequency identification transponders", IET Circuits Devices Syst., 2012, vol. 6, Iss. 2, pp. 79-84.

(Continued)

*Primary Examiner* — Levi Gannon (57) ABSTRACT

Embodiments of an oscillator and a method of operating an oscillator are disclosed. In an embodiment, an oscillator can include a ring oscillator core, a control circuit, and a timer that coordinates timing of the control circuit to avoid a current resulting from a voltage level associated with an output of the ring oscillator core during a startup and to allow the ring oscillator core to operate with a low startup current and a low operational power.

16 Claims, 4 Drawing Sheets

(56) References Cited

U.S. PATENT DOCUMENTS

| | | | |
|---|---|---|---|
| 2003/0085767 A1* | 5/2003 | Nohara | H03M 1/0619 |
| | | | 331/74 |
| 2005/0047265 A1* | 3/2005 | Yada | G06F 1/08 |
| | | | 365/233.1 |
| 2008/0116964 A1* | 5/2008 | Kernahan | H03H 11/265 |
| | | | 327/538 |
| 2014/0022022 A1* | 1/2014 | Choy | G01R 31/2824 |
| | | | 331/57 |
| 2014/0049328 A1* | 2/2014 | Smith | H03K 3/0322 |
| | | | 331/57 |
| 2014/0266475 A1 | 9/2014 | Hinrichs et al. | |
| 2015/0169817 A1 | 6/2015 | Kim et al. | |
| 2015/0171839 A1 | 6/2015 | Bichan et al. | |
| 2015/0180460 A1 | 6/2015 | Kim et al. | |
| 2015/0372685 A1* | 12/2015 | Kitagawa | G11C 7/1066 |
| | | | 331/57 |
| 2016/0336924 A1 | 11/2016 | Yu et al. | |
| 2017/0133938 A1 | 5/2017 | Tiefnig | |
| 2017/0194948 A1 | 6/2017 | Luo et al. | |
| 2017/0257023 A1 | 9/2017 | Wu et al. | |
| 2017/0264272 A1 | 9/2017 | Hatanaka | |
| 2017/0271873 A1 | 9/2017 | Huang et al. | |
| 2018/0240888 A1 | 8/2018 | Oh | |
| 2019/0317547 A1* | 10/2019 | Savoj | G11C 19/28 |

OTHER PUBLICATIONS

Dei, Michele, et al., "A 10-bit Linearity Current-Controlled Ring Oscillator with Rolling Regulation for Smart Sensing", 2017 IEEE.

Jovanovi'c, G., et al., "A CMOS Voltage Controlled Ring Oscillator with Improved Frequency Stability", Scientific Publications of the State University of Novi Pazar, Ser. A: Appl. Math. Inform. and Mech. vol. 2, 1 (2010), 1-9.

Leelarasmee, Ekachai, "A CMOS Current Controlled Ring Oscillator With Wide and Linear Tuning Range", ASEAN Engineering Journal Part A, vol. 1 No. 2, ISSN 2229-127X, pp. 5-10, (2011).

Maghrebi, R., et al., "Modelling of a Current Controlled Oscillator", Lebanese Science Journal, vol. 6, No. 2, 2005, pp. 93-106.

Yang, Wei-Bin, et al., "A Current-Controlled Oscillator with Temperature, Voltage and Process Compensation", Microsyst Technol (2018) 24: 109. Online access: https://doi.org/10.1007/s00542-016-3190-y.

Zha, Qichao, et al., "Design of a 8-bits Digitally Controlled Oscillator with Low Power Consumption", International Journal of Electronics and Electrical Engineering vol. 3, No. 1, Feb. 2015, pp. 66-70.

\* cited by examiner

OSCILLATOR AND METHOD FOR OPERATING AN OSCILLATOR

BACKGROUND

The need for low power circuits has increased significantly due to the tremendous growth in small, portable battery-powered devices and IC (Integrated Circuit) chips that support such devices. Oscillators are important to the efficient operation of such IC chips and associated electronic components and devices due to their ability to provide oscillating output signals for timing and other operations.

One example of an oscillator is a low power oscillator, which can be designed to function with low power applications that, for example, rectify a digital signal to supply an IC chip. In such cases, the power supply for the IC chip has limited loading capability. This means that the oscillator is expected to consume low power during operations. A current controlled ring oscillator is typically used in such situations because it may consume an order less power compared to other types of oscillators such as, for example, a relaxation oscillator.

A low power ring oscillator may output a middle rail signal before it oscillates during the startup phase, which can result in an excessive short-through current from, for example, one or more logic gates that load the oscillator. Such a power consumption peak during the startup phase can collapse the system or cause malfunctions. Thus, an important goal involves minimizing the startup current associated with an oscillator as much as possible.

SUMMARY

Embodiments of an oscillator and a method of operating an oscillator are disclosed. In an embodiment, an oscillator can include a ring oscillator core, a control circuit, and a timer that coordinates timing of the control circuit to avoid a current resulting from a voltage level associated with an output of the ring oscillator core during a startup and to allow the ring oscillator core to operate with a low startup current and a low operational power.

In an embodiment, the control circuit can be gated by the timer, which disables the control circuit when the ring oscillator core is not oscillating to avoid the current from at least one of the control circuit and clock loading stages associated with the timer.

In an embodiment, the timer can be released by a reset signal.

In an embodiment, after a release of the timer by the reset signal, the timer expires and activates the control circuit after a startup time of the ring oscillator core.

In an embodiment, the control circuit can be electronically connected to the ring oscillator core and the timer at an interface between the ring oscillator core and the timer.

In an embodiment, the ring oscillator core can include a current-controlled oscillator core.

In an embodiment, the control circuit can include a level shifter.

In an embodiment, the time can include an analog timer.
In an embodiment, the time can include a digital timer.
In an embodiment, the current can include a short-through current.

In an embodiment, a method of operating an oscillator can involve coordinating a control circuit with a timer to avoid a current resulting from a voltage level associated with an output of a ring oscillator core during a startup phase and to allow the ring oscillator core to operate with a low startup current and a low operational power.

In an embodiment, the method can further involve gating the control circuit by the timer so as to disable the control circuit when the ring oscillator core is not oscillating such that the current from at least one of the control circuit and clock loading stages associated with the timer is avoided.

In an embodiment, the method can further include releasing the timer by a reset signal.

In an embodiment of the method, after the reset signal releases the timer, the timer expires and activates the control circuit after a startup time of the ring oscillator core.

In an embodiment of the method, the control circuit can be electronically connected to the ring oscillator core and the timer at an interface between the ring oscillator core and the timer.

In an embodiment of the method, the ring oscillator core can include a current-controlled oscillator core.

In an embodiment of the method, the control circuit can include a level shifter.

In an embodiment of the method, the time can include at least one of an analog timer and a digital timer.

In an embodiment, an oscillator can include a current-controlled oscillator core, a level shifter, and a timer that coordinates timing of the level shifter to avoid a short-through current resulting from a voltage level associated with an output of the current-controlled oscillator core during a startup and to allow the current-controlled oscillator core to operate with a low startup current and a low operational power.

In an embodiment of the oscillator, the level shifter can be gated by the timer, which disables the level shifter when the current-controlled oscillator core is not oscillating to avoid the short-through current from at least one of the level shifter and clock loading stages associated with the timer.

Other aspects will become apparent from the following detailed description, taken in conjunction with the accompanying drawings, illustrated by way of example of the principles of the disclosed solution.

BRIEF DESCRIPTION OF THE DRAWINGS

Throughout the description, similar reference numbers may be used to identify similar elements.

DETAILED DESCRIPTION

It will be readily understood that the components of the embodiments as described herein and illustrated in the appended figures can be arranged and designed in a wide variety of different configurations. Thus, the following detailed description of various embodiments, as represented in the figures, is not intended to limit the scope of the present disclosure, and may be merely representative of various embodiments. While the various aspects of the embodiments are presented in drawings, the drawings are not necessarily drawn to scale unless specifically indicated.

The disclosed approach may be embodied in other specific forms without departing from its spirit or characteristics. The described solutions are to be considered in all respects only as illustrative and not restrictive. The scope of this disclosure is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may or may not refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment. Thus, the phrases "in one embodiment", "in an embodiment", and similar language throughout this specification may or may not all refer to the same embodiment.

Figure 1:
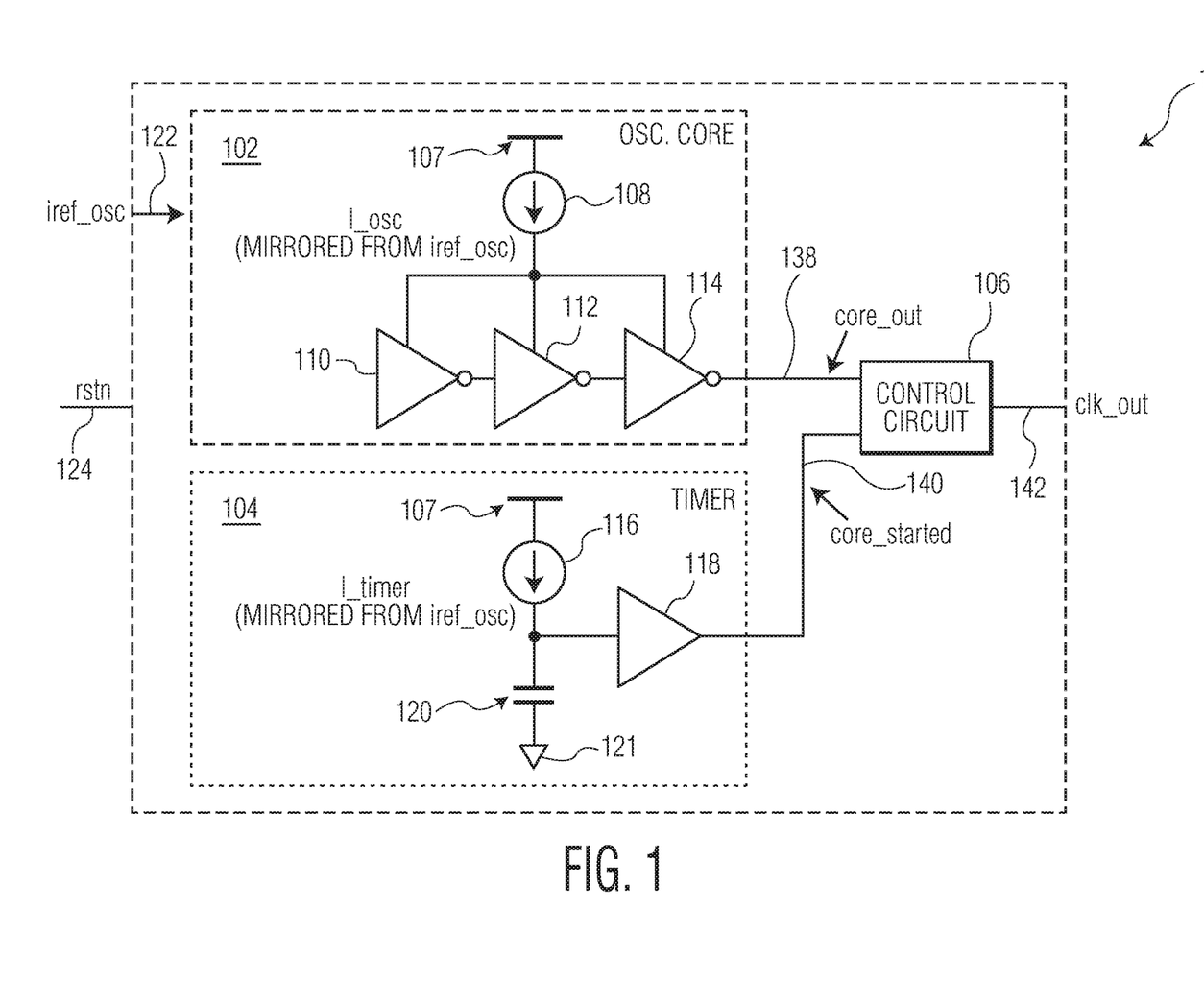
FIG. 1 depicts a schematic circuit diagram of an oscillator configured to operate with a minimized startup current.

FIG. 1 depicts a schematic circuit diagram of an oscillator 100 configured to operate with a reduced startup current. The oscillator 100 shown in FIG. 1 can be implemented as a device, apparatus or system that includes a ring oscillator core 102 that can function as a current-controlled oscillator core. Thus, the oscillator 100 can function as a current-controlled oscillator. As will be discussed in greater detail herein, the oscillator 100 can be arranged such that its startup current can be optimized to reduce the transient current loading for a low power supply.

In addition to the ring oscillator core 102, the oscillator 100 can include a timer 104 (e.g., an analog timer or a digital timer, depending upon design considerations) and a control circuit 106 (e.g., a level shifter or another type of control circuit) configured to bring the core output (e.g., "core_out") to full rail or to perform other logic operations. The timer 104 can coordinate the moment that the control circuit 106 is activated to avoid a short-through current due to the voltage level (e.g., voltage level ambiguity such as an undetermined voltage level) of the core output during the startup, which could potentially stress the power supply to the extent that it now operates with limited loading capabilities.

Thus, timer 104 coordinates the moment or time that the control circuit 106 is activated to avoid a current (e.g., short-through current) resulting from the voltage level associated with the output of the ring oscillator core 102 during a startup phase and to allow the ring oscillator core 102 to operate with a low startup current and a low operational power, as discussed herein.

In an embodiment activating the control circuit 106 can involve applying power to the control circuit 106 to take the control circuit 106 from an unpowered state to a powered state. In another embodiment, activating the control circuit 106 can involve applying a control signal to take the control circuit 106 from a non-functional mode (e.g., in which some of the circuits or sub-circuits in the control circuit 106 are unpowered) to a functional mode (e.g., in which all of the circuits needed to provide full functionality of the control circuit 106 are powered). In addition, the term "non-functional mode" may relate to a "low power non-functional mode", which can be a mode wherein some of the circuits in the control circuit 106 are unpowered (thus saving power). Note that "to activate," "activated," "activates," and word variations thereof can be encompassed by the definition of "activating" discussed above.

Thus, the timer 104 can coordinate timing of the control circuit 106 so as to avoid a current (e.g., short-through current) resulting from an undetermined voltage level associated with the output of the ring oscillator core 102 during a startup. As will be explained shortly, during the startup phase (e.g., time, $t_{startup}$) or "startup", the output of the ring oscillator core 102 may be undetermined (e.g., an ambiguous voltage level), which is one of the causes of current such as a short-through current.

As a result of coordinating the timing of the control circuit 106 as discussed above, the oscillator 100 can achieve a low startup current in addition to a low operational power. The oscillator 100 can thus be architected to include the use of the timer 104 to coordinate the avoidance or prevention of a short-through current of the oscillator 100 during the startup phase. Note that as utilized in this context, the terms "avoid" or "avoidance" can relate to the prevention of the occurrence or effectiveness of a current such as the short-through current discussed herein.

The ring oscillator core 102 can include a group of inverters 110, 112, and 114 electronically in series with one another while also tied to a current source 108 that in turn can connect electronically to a voltage source 107. Although inverter 110, inverter 112, and inverter 114 are shown in FIG. 1 with respect to the ring oscillator core 102, fewer or more inverters may be implemented in the context of other embodiments. In other words, the embodiments are not limited to the use of inverter 110, inverter 112, and inverter 114, and can include additional or fewer inverters.

A reference current signal 122 ("iref_osc") can be input to the ring oscillator core 102 and timer 104 for biasing generation purposes. The ring oscillator core 102 and the timer 104 can generate a bias current with different ratios from this reference current to minimize PVT (process, voltage and temperature) variations. This reference current can be generated within the oscillator 100 in some configurations.

The timer 104 can be a sub-circuit of the oscillator 180 that includes a current source 116 that connects electronically to a capacitor 120 and an amplifier 118. The current source can also connect electronically to the voltage source 107. The capacitor 120 is also coupled to ground 121 and the output from the amplifier 118 can be connected electronically to the control circuit 106. The output from the amplifier 118, which also constitutes the output from the timer 104, provides the core startup signal 140 ("core_started") as shown in FIG. 1. Finally, the control circuit 106 can provide an output clock signal 142 ("clk_out").

An example of a working principle of the oscillator 100 is shown in FIG. 1. In some example embodiments, the oscillator 100 may be configured as a ring oscillator that provides an oscillating output signal. The oscillator 100 can function as a current-controlled oscillator and can be configured to limit power consumption. In general, the clock loading stages provided by the timer 104 are not directly loaded to the ring oscillator core 102. The control circuit 106 can be applied at the interface between the ring oscillator core 102 and the timer 104. The ring oscillator core 102 functions at a lower voltage supply level to reduce power consumption, and the control circuit 106 may be used to bring the core output to the specified swing (e.g., a voltage $V_{dd}$ swing level).

The control circuit 106 (e.g., a controller such as a level shifter) can be subject to a timing signal provided by the timer 104 as input to the control circuit 106. The timing signal can be used to disable the control circuit 106 during the time or period when the ring oscillator core 102 is not oscillating. As a result, the short-through current from either the control circuit 106 or following clock stages (not shown in FIG. 1) can be avoided. Note that the term "disable" and word variations thereof can relate to "disabling" or putting the control circuit 106 (or the control logic associated with the control circuit 106) temporarily "out of action" or limiting its ability to operate during the time in which the ring oscillator core 102 is not oscillating.

Thus, in an embodiment disabling the control circuit 106 can involve removing power from the control circuit 106 to take the control circuit 106 from a powered state to an unpowered state. In another embodiment, disabling the control circuit 106 can involve applying a control signal to take the control circuit 106 from a functional mode to a non-functional mode.

The timer 104 can be released (allowed to act freely) via a reset signal 124 (e.g., shown as "rstn" in FIG. 1), which indicates that the supply and bias current of the oscillator 100 are within specifications. Once released, the timer 104 expires and can activate the control circuit 106 after the startup time of the ring oscillator core 102. The timer 104 can be implemented as a current over capacitor delay cell. Note that the current is a ratio of the ring oscillator core current so as to reduce PVT (Process, Voltage, and Temperature) variations. The current can be potentially implemented in the context of other oscillator configurations as long as the current provides a reliable delay more than the oscillator core startup time after the supply and bias current are within operating specifications.

The oscillator 100 shown in FIG. 1 thus can function as a low power oscillator that includes the ring oscillator core 102, the control circuit 106, and the timer 104. This configuration allows the timer 104 to coordinate timing of the control circuit 106 to avoid a short-through current resulting from voltage level ambiguity (e.g., such as an undetermined voltage level output) associated with an output of the ring oscillator core 102 during a startup, which allows the oscillator 100 to operate with a low startup current and a low operational power.

Note that in some embodiments, a "low power" or "low operational power" or "power consumption" can be, for example, approximately 3μ Watts with a supply of voltage of 1V to 2V. The additional power consumption during startup can be, for example, about 1 μW to 2 μW (microwatt). The oscillator, method and system described herein can also be used for applications in the nW (nanoWatt) range. The terms "low power" or "low operational power" as utilized herein can thus relate to devices and applications that can operate with power in the μW and nW power ranges. In some cases, "low power" or "low operational power" or "power consumption" may also relate to devices, circuits and applications that operate in the milliwatt range. A "low startup current" can similarly be a current in the μW and nW and milliwatt power ranges.

Figure 2:
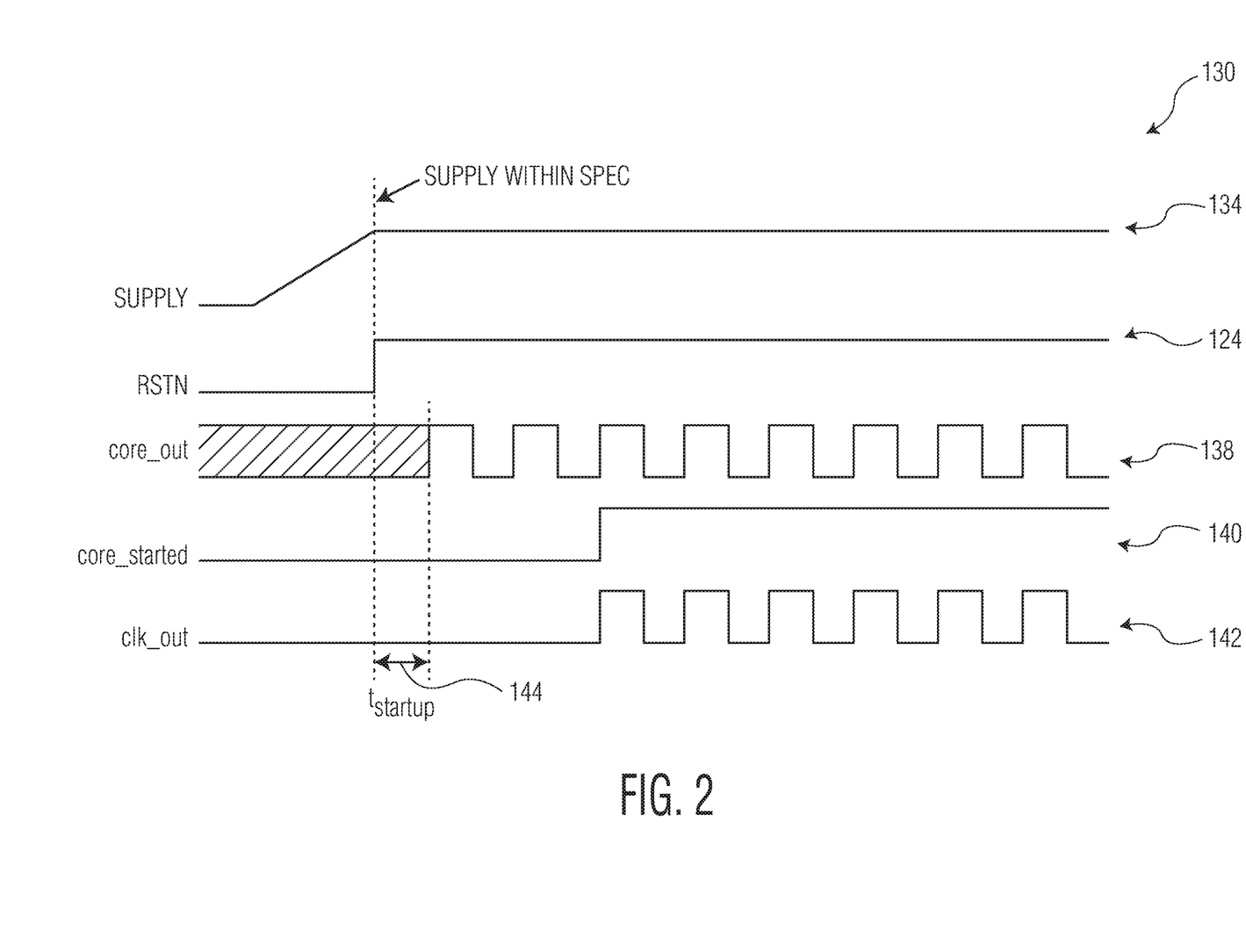
FIG. 2 depicts a timing diagram that corresponds to the disclosed oscillator ring, which illustrates a sequence of the oscillator startup behavior.
Figure 3:
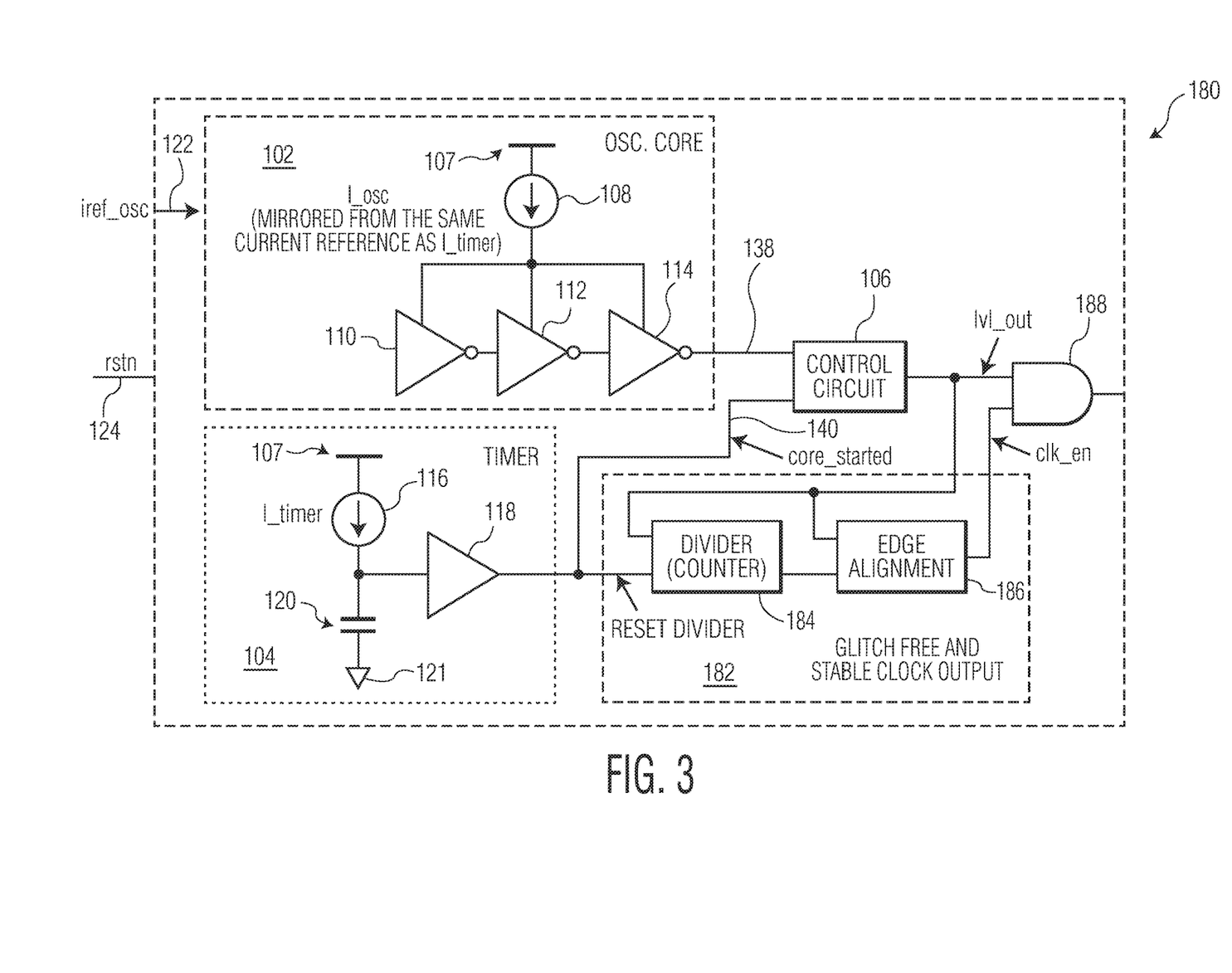
FIG. 3 depicts a schematic diagram of an oscillator having a glitch free and stable frequency start with a minimized or limited startup current.

FIG. 2 depicts a timing diagram 130 that is associated with the operation of the ring oscillator core 102 depicted in FIG. 1 and FIG. 3. The sequence of the oscillator startup behavior is explained by the example timing signals shown in FIG. 2. For example, a supply signal 134 ("supply"), a reset signal 124 ("rstn"), an output 138 ("core_out"), a core startup signal 140 ("core_started"), and an output clock signal 142 ("clk_out") are shown in the timing diagram 130 in FIG. 2.

In general, a power supply and a current (note that the bias current is not shown in FIG. 2) can trigger the reset signal 124 (also shown as "rstn" in FIG. 2) to a logic "high" and initiate the timer 104 at the same time. It is clear from the figure that during the "$t_{startup}$" or startup phase 144, the output 138 of the core 102 is undetermined or ambiguous (e.g., see the hatched section in the timing diagram 130 of FIG. 2), which can be the root cause for any startup shot-through current.

The timer 104 asserts the "core_started" (i.e., core startup signal 140) after the ring oscillator core 102 begins to oscillate at the "core_out" (i.e., core output signal 138). Thereafter, "clk_out" (i.e., output clock signal 142) is available to the following loading stages.

The output clock signal 142 from the control circuit 106 can pass to additional counters to further delay the "clk_out" output clock signal 142 in applications that may need a stable clock once available and thereby avoid any settling behavior. An example of an oscillator of this type is shown in greater detail in FIG. 3.

FIG. 3 depicts a schematic diagram of an oscillator 180 having a malfunction free and stable frequency start with a reduced startup current. Note that the oscillator 180 shown in FIG. 3 is an alternative version of the oscillator 100 depicted in FIG. 1. The oscillator 180 can also function as a low power oscillator. In FIGS. 1-3 herein, similar or identical components or elements are indicated by identical reference numerals. Thus, the oscillator 100 can include the ring oscillator core 102, the timer 104, and the control circuit 106 as shown in FIG. 1, albeit with some additional components and features.

For example, as depicted in FIG. 3, the core startup signal 140 ("core_started") that is output from the amplifier 118, in addition to being electronically connected to the control circuit 106, can connect electronically to a divider 184 (e.g., a counter), which in turn can connect electronically to an edge alignment device 186. The output from the amplifier 118 can be transmitted to the divider 180 as a reset signal ("Reset Divider") such as the reset signal 124 shown in FIG. 2, and to the control circuit 106 as the core startup signal 140. The divider 184 and the edge alignment device 186 can together form at least a portion of the loading stage 182 for the oscillator 180.

The divider 184 and the edge alignment device 186 further connect electronically to the output of the control circuit 106 and to an input to an AND gate 188. For example, an output from the edge alignment device 186 connects electronically to an input (i.e., "clk_en") to the AND gate 188, and an input to the edge alignment device 186 and an input to the divider 184 connect electronically to another input (i.e., "lvl_out") of the AND gate 188. The divider 184 provides the delay for the settling of oscillator frequency.

The edge alignment device 186 can align the divider output with respect to the transition edges of the control circuit output so that a "glitch" (e.g., a sudden malfunction or irregularity) at the output of the AND gate 188 may be avoided, because "clk_en" can be asserted at the "lvl_out" transitions. The loading stage 182 together with the AND gate 188 can thus assist in facilitating a "glitch" free and stable clock output.

Figure 4:
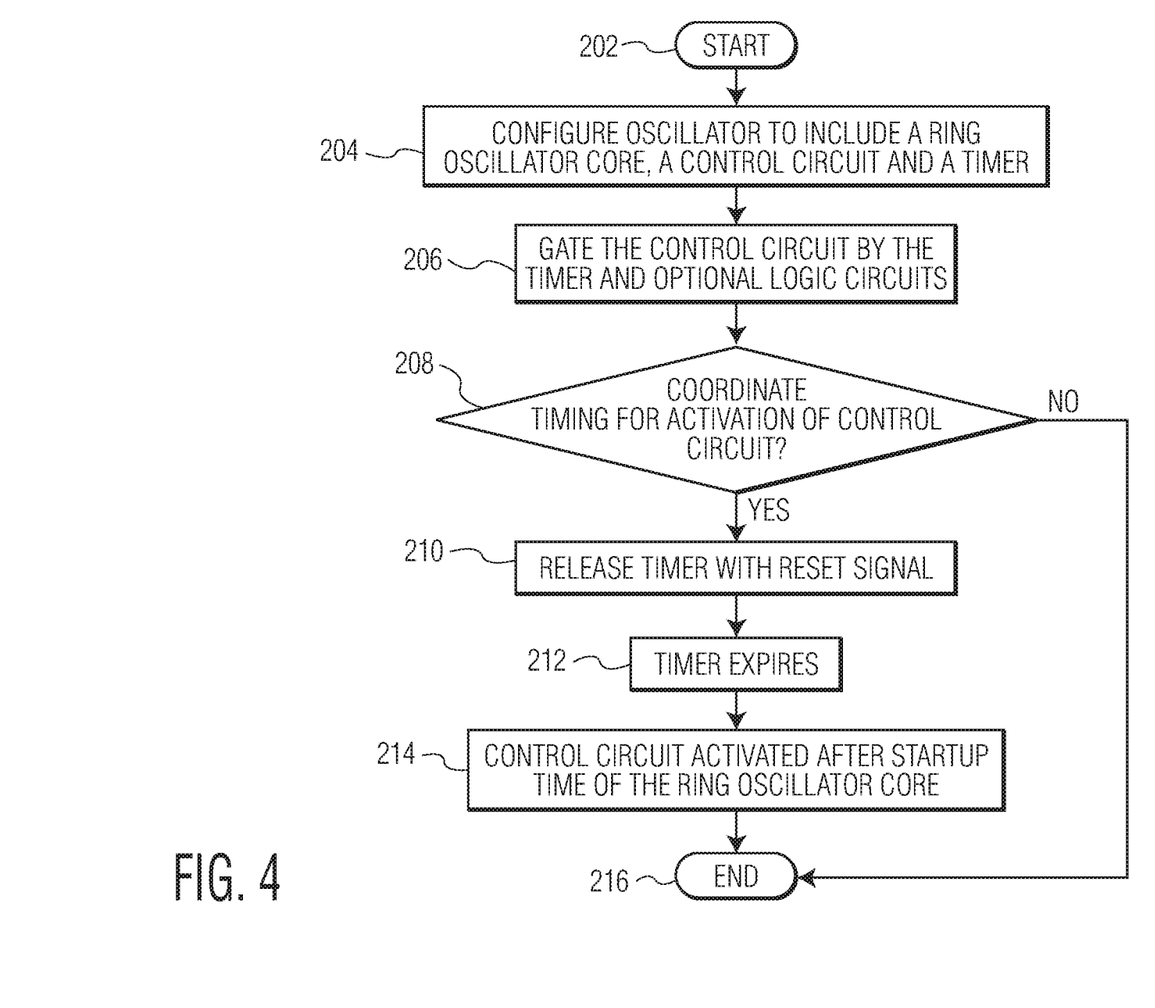
FIG. 4 depicts a flow chart of operations depicting operational steps of a method of operating an oscillator with a minimized or limited startup current.

FIG. 4 depicts a flow chart of operations depicting operational steps of a method 200 of operating a low power oscillator (such as the oscillator 180) with a reduced startup current. As shown at block 202, the process can be initiated. As depicted at block 204, an oscillator such as the oscillator 100 or oscillator 180 discussed previously herein can be configured to incorporate components such as the ring oscillator core 102, the timer 104, and the control circuit 106, also previously discussed herein.

Steps or operations can be then implemented, as shown beginning with block 206, wherein the control logic is gated by the timer 104 and optional logic circuits, which results in disablement of the control circuit 106 when the oscillator core is not oscillating (and as a result, the startup short-through current from either the control circuit 106 or following clock loading stages can also be avoided). Note that "disablement" as utilized in this context relates to making or rendering the control circuit 106 inactive.

As shown next at decision block 208, a step or operation can be implemented to determine whether or not to coordinate timing of the control circuit 106 to facilitate the prevention or avoidance of the short-through current that results from the voltage level ambiguity (e.g., undetermined voltage level), as discussed previously. Coordinating timing of the control circuit 106 can involve coordinating the moment or time in which the control circuit 106 becomes active. If these actions are not implemented, then the process simply terminates, as indicated at block 216.

If these actions are to be implemented, then the timer coordinates the control circuit, as discussed herein. That is, as shown at block 210, a step or operation can be implemented in which the timer 104 is released by the reset signal 124 (e.g., the reset signal 124 discussed previously with respect to FIG. 2), which indicates that the supply and bias current associated with the oscillator are within specifications.

Once released, as shown next at block 212, a step or operation can be implemented in which the timer 104 expires. Then, as depicted at block 214, the control circuit 106 can be activated after the startup time of the ring oscillator core 102. The process can then end, as shown at block 216.

It can be appreciated that the method 200 shown in FIG. 4 is one possible method that can be implemented for operating an oscillator such as the oscillators 100 and 180 discussed herein. Other methods and variations may involve the use of additional components and features such as the divider 184, the edge alignment device 186, and so on as shown in FIG. 3.

Although the operations of the method(s) herein are shown and described in a particular order, the order of the operations may be altered so that certain operations may be performed in an inverse order or so that certain operations may be performed, at least in part, concurrently with other operations. Instructions or sub-operations of distinct operations can be implemented in an intermittent and/or alternating manner.

In some alternative implementations, the functions noted in the blocks may occur out of the order noted in the figures. For example, two blocks shown in succession may, in fact, be executed concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The various embodiments discussed herein can be implemented in a number of different applications that feature low power usage. One example application can involve energy harvesting in low power devices or systems. For example, the disclosed devices, methods, and systems may be implemented to assist in the extraction of power from signals such as cell phone signals.

Energy harvesting from an ambient source such as a photovoltaic cell (PV), a radio frequency (RF) device, a thermoelectric generator (TEG), or a piezoelectric material (such as lead zirconate titanate), for example, is particularly well-suited for use in IoT (Internet of Things) products and applications. The Internet of Things (IoT) is the network of physical objects or "things" embedded with electronics, software, sensors, and network connectivity, which allow such objects to collect and exchange data. The IoT allows objects to be sensed and controlled remotely across existing network infrastructure, creating opportunities for more direct integration between the physical world and computer-based systems, and resulting in improved efficiency, accuracy and economic benefit. The "things" in the "Internet of Things" are uniquely identifiable through an embedded computing system and are able to interoperate within the existing Internet infrastructure. Energy harvesting may be utilized in an IoT application where on-line utility power is not reachable and an off-line stand-alone battery does not fit due to constrains in size and/or weight. The disclosed embodiments are ideally suited for such IoT applications.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An oscillator, comprising:
   an output;
   a ring oscillator core configured to generate an output clock signal on the output;
   a control circuit coupled between the output and the ring oscillator core; and
   a timer that disables the control circuit until oscillation of the ring oscillator core begins;
   wherein the timer is released by a reset signal; and
   wherein after a release of the timer by the reset signal, the timer expires and activates the control circuit after a startup time of the ring oscillator core.

2. The oscillator of claim 1
   wherein the control circuit is electronically coupled between the ring oscillator core and the timer.

3. The oscillator of claim 1
   wherein said ring oscillator core includes a current-controlled oscillator core.

4. The oscillator of claim 1 wherein said control circuit includes a level shifter.

5. The oscillator of claim 1 wherein said timer includes an analog timer.

6. The oscillator of claim 1 wherein said timer includes a digital timer.

7. The oscillator of claim 1:
wherein the output is configured to be coupled to a set of loading stages that are configured to draw a current from the output clock signal; and
wherein said current includes a short-through current.

8. A method of operating an oscillator, comprising:
coordinating a control circuit with a timer
to avoid a current resulting from a voltage level associated with an output of a ring oscillator core during a startup phase and
to allow the ring oscillator core to operate with a low startup current and a low operational power; and
releasing the timer by a reset signal;
wherein after the reset signal releases the timer, the timer expires and activates the control circuit after a startup time of the ring oscillator core.

9. The method of claim 8 further comprising
gating the control circuit by the timer so as to disable the control circuit when the ring oscillator core is not oscillating such that the current from at least one of the control circuit and clock loading stages associated with the timer is avoided.

10. The method of claim 8
wherein the control circuit is electronically connected to the ring oscillator core and the timer at an interface between the ring oscillator core and the timer.

11. The method of claim 8
wherein said ring oscillator core comprises a current-controlled oscillator core.

12. The method of claim 8 wherein said control circuit comprises a level shifter.

13. The method of claim 8 wherein said timer comprises at least one of an analog timer and a digital timer.

14. An oscillator, comprising:
an output;
a current-controlled oscillator core configured to generate an output clock signal on the output;
a level shifter coupled between the output and the current-controlled oscillator core; and
a timer that disables the level shifter until oscillation of the current-controlled oscillator core begins;
wherein the timer is released by a reset signal; and
wherein after a release of the timer by the reset signal, the timer expires and activates the level shifter after a startup time of the current-controlled oscillator core.

15. The oscillator of claim 14:
wherein the output is configured to be coupled to a set of loading stages that are configured to draw a current from the output clock signal;
wherein the current includes a short-through current; and
wherein the disabled level shifter is configured to block the short-through current.

16. An oscillator, comprising:
a ring oscillator core;
a control circuit;
a timer that coordinates timing of the control circuit,
to avoid a current resulting from a voltage level associated with an output of the ring oscillator core during a startup; and
to allow the ring oscillator core to operate with a low startup current and a low operational power;
wherein the timer is released by a reset signal; and
wherein after a release of the timer by the reset signal, the timer expires and activates the control circuit after a startup time of the ring oscillator core.

\* \* \* \* \*